United States Patent
Chen et al.

(10) Patent No.: US 9,553,160 B2
(45) Date of Patent: Jan. 24, 2017

(54) MECHANISMS FOR MONITORING IMPURITY IN HIGH-K DIELECTRIC FILM

(71) Applicant: TAIWAN SEMICONDUCTOR MANUFACTURING CO., LTD., Hsin-Chu (TW)

(72) Inventors: Wei-Jen Chen, Taichung (TW); Yen-Yu Chen, Taichung (TW); Chang-Sheng Lee, Hsin-Chu (TW); Wei Zhang, Chupei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/049,657

(22) Filed: Oct. 9, 2013

(65) Prior Publication Data
US 2015/0099315 A1  Apr. 9, 2015

(51) Int. Cl.
H01L 21/66 (2006.01)
G01R 31/26 (2014.01)
H01L 29/49 (2006.01)
H01L 29/51 (2006.01)
H01L 21/28 (2006.01)

(52) U.S. Cl.
CPC .......... H01L 29/4966 (2013.01); H01L 22/12 (2013.01); H01L 22/20 (2013.01); H01L 29/513 (2013.01); H01L 29/517 (2013.01); H01L 21/28194 (2013.01)

(58) Field of Classification Search
CPC .......... H01L 22/00; H01L 22/10; H01L 22/12; H01L 22/14; H01L 22/20; H01L 22/22; H01L 22/24; H01L 22/26; H01L 22/30; H01L 22/32; H01L 22/34; G01N 21/00

USPC ................... 438/14–18, FOR. 101, FOR. 102,438/FOR. 142; 257/E21.521, E21.529, E21.53, 257/E21.525, E21.526, E21.527, E21.5, 28
See application file for complete search history.

(56) References Cited

U.S. PATENT DOCUMENTS

| | | | |
|---|---|---|---|
| 5,298,860 A | 3/1994 | Kato | |
| 6,613,697 B1* | 9/2003 | Faur et al. | ..................... 438/770 |
| 6,905,893 B1* | 6/2005 | Narayanan | .............. H01L 22/20 257/E21.525 |
| 2004/0142835 A1* | 7/2004 | Takashima | ........... C11D 3/2034 510/175 |
| 2005/0130442 A1* | 6/2005 | Visokay | ............ H01L 21/02148 438/775 |
| 2005/0269651 A1* | 12/2005 | Chen | ................... C23C 16/0218 257/411 |
| 2008/0317972 A1* | 12/2008 | Hendriks | ................ C23C 16/18 427/569 |

(Continued)

*Primary Examiner* — Thao X Le
*Assistant Examiner* — Nduka Ojeh
(74) *Attorney, Agent, or Firm* — Birch, Stewart, Kolasch & Birch, LLP

(57) ABSTRACT

Embodiments of mechanisms of monitoring metal impurity in a high-k dielectric film are provided. The method includes forming an interfacial layer over a substrate. The method also includes forming a high-k dielectric film on the interfacial layer, and the interfacial layer and the high-k dielectric film form a stacked structure over the substrate. The method further includes conducting the first thickness measurement on the stacked structure. In addition, the method includes performing a treatment to the stacked structure after the first thickness measurement, and the treatment includes an annealing process. The method also includes conducting the second thickness measurement on the stacked structure after the treatment.

7 Claims, 6 Drawing Sheets

(56) References Cited

U.S. PATENT DOCUMENTS

2009/0226341 A1\* 9/2009 Shindo .................. B22D 27/02
420/423
2011/0260255 A1\* 10/2011 Wang ................ H01L 21/28176
257/368

\* cited by examiner

MECHANISMS FOR MONITORING IMPURITY IN HIGH-K DIELECTRIC FILM

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS technology process flow due to various factors such as incompatibility of materials, complex processes, and thermal budgets.

BRIEF DESCRIPTION OF THE DRAWING

For a more complete understanding of the present disclosure, and the advantages thereof, reference is now made to the following descriptions taken in conjunction with the accompanying drawings.

DETAILED DESCRIPTION

Figure 1:
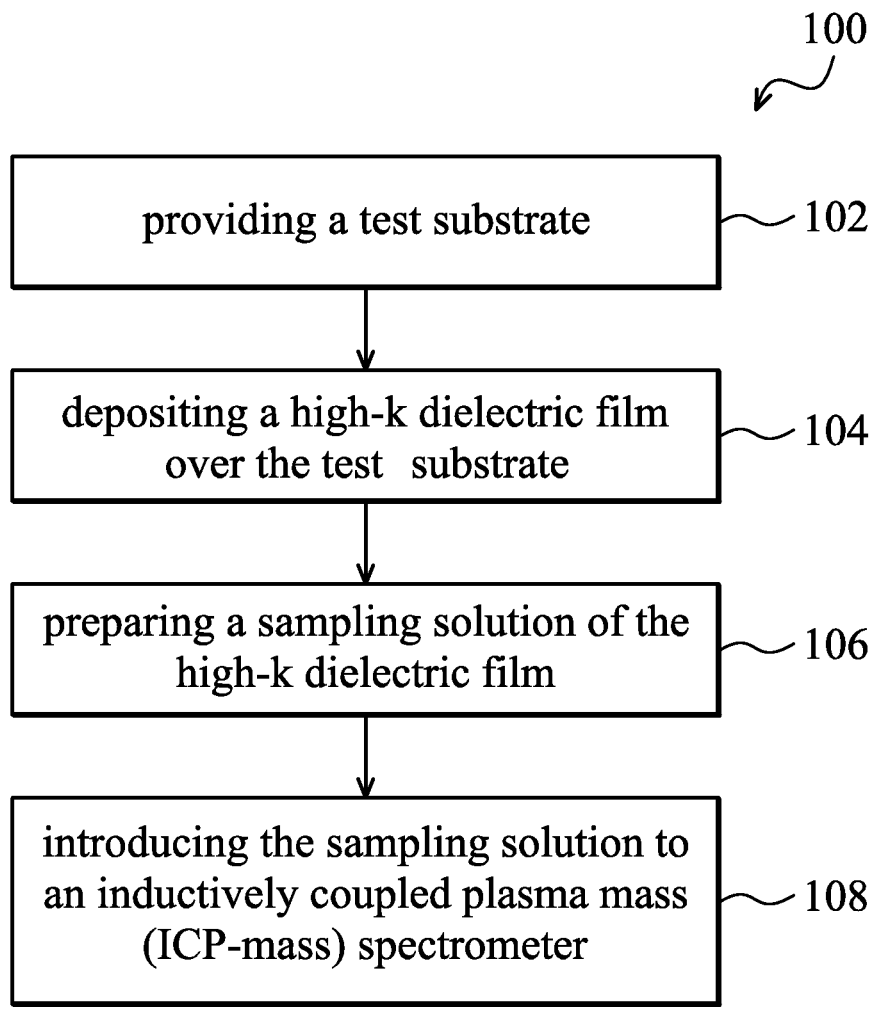
FIG. 1 is a flowchart that illustrates a method for monitoring impurity concentrations in a high-k dielectric film of a semiconductor device, in accordance with some embodiments.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact. In addition, like elements in various figures and embodiments are identified by the same or similar reference numerals.

High quality film is a basic requirement for advanced IC devices. Any impurity contained in the film can easily impact device performance. For CMOS semiconductor devices, a low quality gate dielectric film which has a high concentration of impurity has a low equivalent oxide thickness (EOT), and it may impact device performance. A high quality gate dielectric film which has low impurity can avoid device performance shift. However, the impurity often times comes from by-products of precursors of the gate dielectric film and accompanies the precursors. Therefore, in order to maintain the quality of the gate dielectric film, monitoring impurity concentration in the gate dielectric film at regular intervals is needed.

FIG. 1 is a flowchart that illustrates a method 100 for monitoring impurity concentrations in a high-k dielectric film of a semiconductor device, in accordance with some embodiments. The method 100 begins with operation 102, in which a test substrate is provided. For example, the test substrate may be a semiconductor blank wafer. The semiconductor blank wafer may be a silicon wafer, GaAs wafer or SiGe wafer.

The method 100 continues with operation 104 in which a high-k dielectric film is deposited over the test substrate. The high-k dielectric film may be formed of a metal oxide material with a dielectric constant higher than that (e.g., 3.9) of silicon oxide. In some embodiments, the high-k dielectric film is made of $HfO_x$ ($0<x\leq2$). Alternatively, the high-k dielectric film may optionally include LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, or other suitable high-k dielectric materials, and/or combinations thereof. The high-k dielectric film may be deposited by a suitable method, such as atomic layer deposition (ALD), chemical vapor deposition (CVD), metalorganic chemical vapor deposition (MOCVD), physical vapor deposition (PVD), plasma enhanced chemical vapor deposition (PECVD), plasma enhanced atomic layer deposition (PEALD), combinations thereof, and other suitable techniques. In some embodiments, an interfacial layer is formed over the test substrate prior to the high-k dielectric film. The interfacial layer may include silicon oxide. Alternatively, the interfacial layer may optionally include HfSiON or SiON. The interfacial layer is formed by thermal oxidization or any suitable deposition method.

Experiments show that the main impurity in the high-k dielectric film is metal impurity, such as metal elements and/or their ions. For example, the metal impurity in the high-k dielectric film may include ions of Ti, Fe, Al, Cr, Ni, Co, Cu, Ca, Mg or Zn or a combination thereof. As described above, the main impurity may come from the by-products of the precursors of the high-k dielectric film. For example, in some embodiments, the main impurity is $Ti^{4+}$ when the high-k dielectric film is made of $HfO_2$. The $Ti^{4+}$-impurity may come from $TiCl_4$. $TiCl_4$ is the main by-product of $HfCl_4$, the precursor of the $HfO_2$ high-k dielectric film, and is accompanied with $HfCl_4$.

The method continues with operation 106 in which a sampling solution of the high-k dielectric film is prepared. In some embodiments, a dilute HF solution is used to etch and dissolve the high-k dielectric film. The high-k dielectric film on the test substrate may be placed into the dilute HF solution for one or more days to be dissolved and form the sampling solution. In some embodiments, the test substrate and the interfacial layer is also dissolved into the sampling solution. In some embodiments, the dilute HF solution is an aqueous solution and includes about 5 wt % to 20 wt % of HF.

Afterwards, the method 100 continues with operation 108, in which the sampling solution is introduced to an inductively coupled plasma mass (ICP-mass) spectrometer. The sampling solution is vaporized to form aerosol and then ionized by plasma. The ionized aerosol is then introduced to a mass detector to measure weights and amounts of the metal elements contained in the sampling solution. Therefore, the kinds and amounts of the metal elements, including the metal components of the high-k dielectric film and the metal impurity in the high-k dielectric film, can be analyzed by the ICP-mass spectrometer. The operation time of the ICP-mass spectrometer may be one or more days.

In some embodiments, a tool for depositing the high-k dielectric film is stopped for troubleshooting, such as replacing precursor ampoule and/or adjusting hardware parameters adjust, if the impurity concentration of the high-k dielectric film monitored by the method 100 is unacceptable. Thereafter, the method 100 is repeated to measure the quality of the high-k dielectric film again. The troubleshooting and the method 100 are repeated until the impurity concentration of the high-k dielectric film measured by the method 100 is acceptable.

By using the method 100, the kinds and concentrations of metal impurities in the high-k dielectric film can be measured by ICP-mass spectrometry. However, the method 100 is usually performed on the test substrate, detecting the whole high-k dielectric film. In addition, the method 100 takes a long time and easily suffers from the ion suppression effect. For example, the method 100 needs two or more days to prepare the sample solution (i.e., operation 106) and measure the metal elements by the ICP-mass spectrometer (i.e., operation 108). The ion suppression effect is a common defect of mass spectrometers, and it may cause the data obtained by the method 100 to be unstable. Moreover, the dilute HF solution for preparing the sampling solution is toxic.

The above defects make the method 100 mainly applicable to the test substrate and not suitable for being carried out frequently. The method 100 is usually carried out only when the fabrication line is stopped to perform preventive maintenance. In some embodiments, the preventive maintenance is performed at regular intervals of about one month. Over 3,000 pieces of wafers may be used to fabricate semiconductor devices during the regular intervals. Therefore, the quality of the high-k dielectric films on over 3,000 pieces of wafers may escape monitoring. In addition, once the quality of the high-k film is unsatisfied, it may need another long time period to confirm the quality of the high-k film after the troubleshooting. Such a long time period for the method 100 may impact productivity on the fabrication line. Therefore, it is desirable to find alternative mechanisms for monitoring the quality of a high-k dielectric film.

Figure 2:
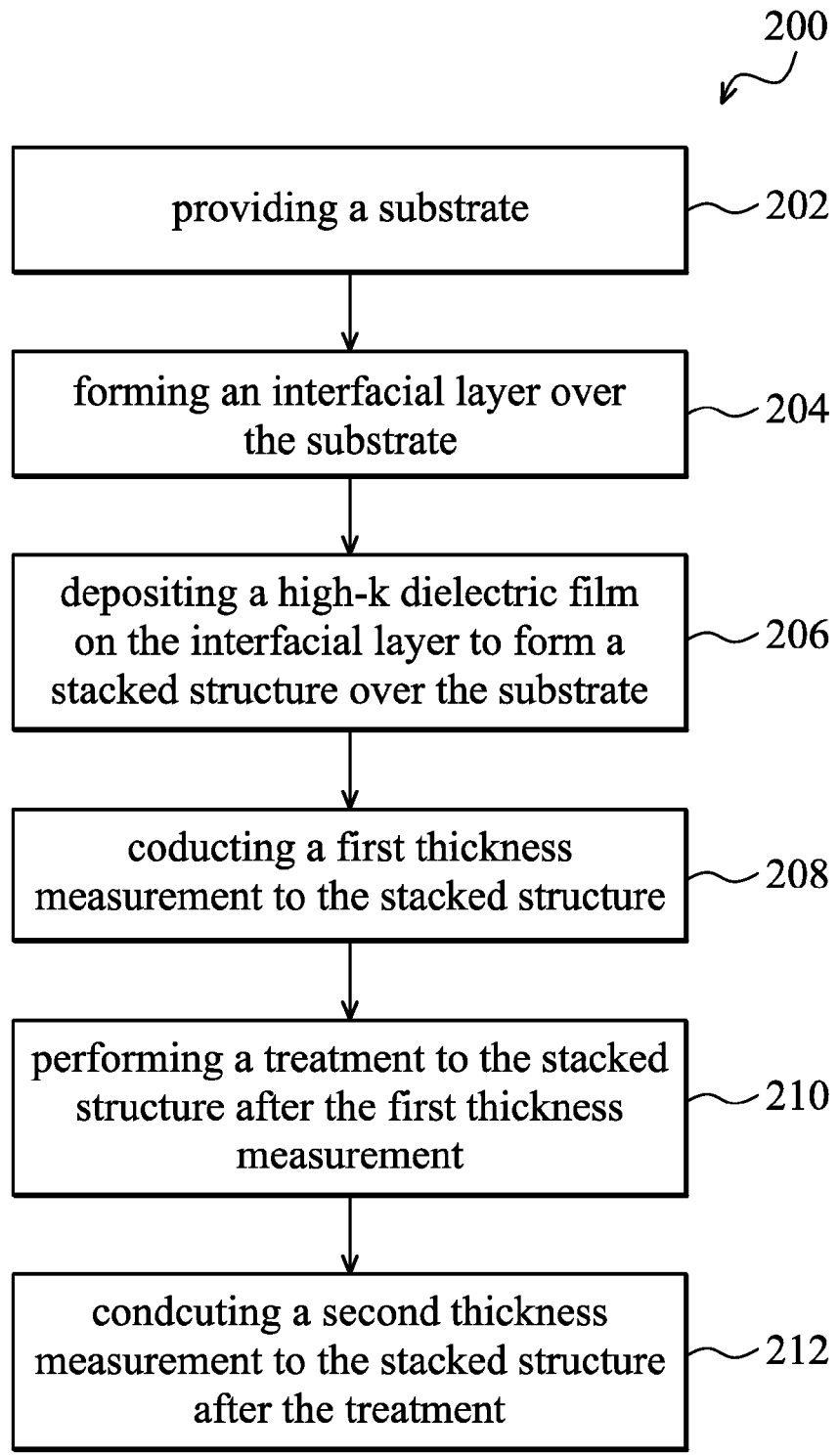
FIG. 2 is a flowchart that illustrates a method for fabricating a semiconductor device with real-time monitoring of the impurity concentration in a high-k dielectric film, in accordance with some embodiments.

FIG. 2 is a flowchart that illustrates a method 200 for fabricating a semiconductor device with real-time monitoring impurity concentrations in a high-k dielectric film, in accordance some embodiments. The method 200 starts with operation 202, in which a substrate is provided. The method 200 continues with operation 204 in which an interfacial layer is formed over the substrate. The method 200 continues with operation 206 in which a high-k dielectric film is formed over the interfacial layer to form a stacked structure over the substrate. The method 200 continues with operation 208 in which the first thickness measurement is conducted on the stacked structure. The method 200 continues with operation 210 in which a treatment is performed to the stacked structure after the first thickness measurement. The method 200 continues with operation 212 in which the second thickness measurement is conduced to the stacked structure after the treatment. It should be noted that the method 200 may be compatible with a CMOS process flow. Accordingly, additional processes may be provided before, during, and/or after the method 200, and that some other processes may only be briefly described herein.

Referring also to FIGS. 3A to 3F, illustrated are cross-sectional views of a semiconductor device 300 at various stages of fabrication according to the method 200, in accordance with some embodiments. FIGS. 3A to 3F have been simplified for the sake of clarity and to better understand the embodiments of the present disclosure.

Figure 3A:
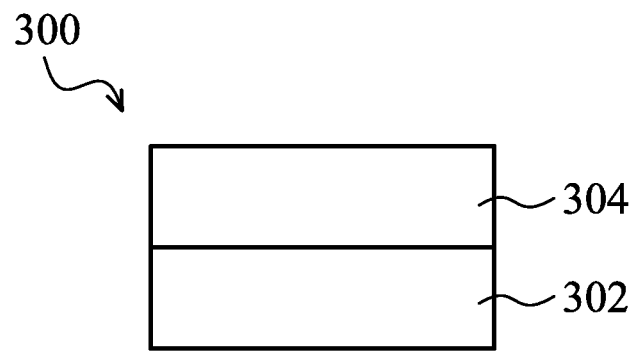
FIGS. 3A to 3F illustrate cross-sectional views of a semiconductor device at various stages of fabrication, in accordance with some embodiments.

In FIG. 3A, a substrate 302 is provided, and an interfacial layer 304 is formed over the substrate 302, in accordance with some embodiments. In some embodiments, the substrate 302 is a device substrate, such as an inline wafer. For example, the substrate 302 is a semiconductor substrate including silicon. Alternatively, the substrate 302 includes germanium, or silicon germanium. Also alternatively, the substrate 302 may include an epitaxial layer. For example, the substrate 302 may have an epitaxial layer overlying a bulk semiconductor. Further, the substrate 302 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 302 may include a semiconductor-on-insulator (SOI) structure. Also alternatively, the substrate 302 may include a buried dielectric layer, such as a buried oxide (BOX) layer, such as that formed by separation by implantation of oxygen (SIMOX) technology, wafer bonding, selective epitaxial growth (SEG), or another appropriate method.

The interfacial layer 304 may include an oxide material. For example, the interfacial layer 304 may include silicon oxide. Alternatively, the interfacial layer 304 may optionally include HfSiON or SiON. The interfacial layer 304 may be formed by thermal oxidization, plasma oxidation, other suitable deposition methods, or combinations thereof. In some embodiments, the interfacial layer 304 has a thickness ranging from about 3 Å to about 20 Å.

Figure 3B:
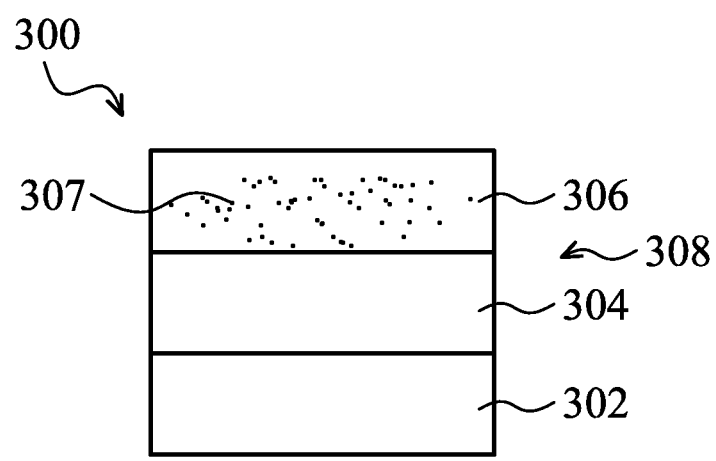

In FIG. 3B, a high-k dielectric film 306 is deposited on the interfacial layer 304 to form a stacked structure 308 over the substrate 302, in accordance with some embodiments. The stacked structure 308 includes the interfacial layer 304 and the high-k dielectric film 306. The high-k dielectric film 306 may be made of a metal oxide material. For example, the high-k dielectric film may include $HfO_x$ ($0<x\leq2$). Alternatively, the high-k dielectric film 306 may include LaO, AlO, ZrO, $Ta_2O_5$, $Y_2O_3$, BaZrO, HfZrO, HfLaO, HMO, HfSiO, HfSiON, LaSiO, AlSiO, $Al_2O_3$, or other suitable high-k dielectric materials, and/or combinations thereof. In some embodiments, the high-k dielectric film 306 has a thickness ranging from about 10 Å to about 30 Å. The high-k dielectric film 306 may be formed by ALD, CVD, MOCVD, PVD, plasma enhanced CVD (PECVD), plasma enhanced ALD (PEALD), combinations thereof, or other suitable techniques.

Figure 3C:
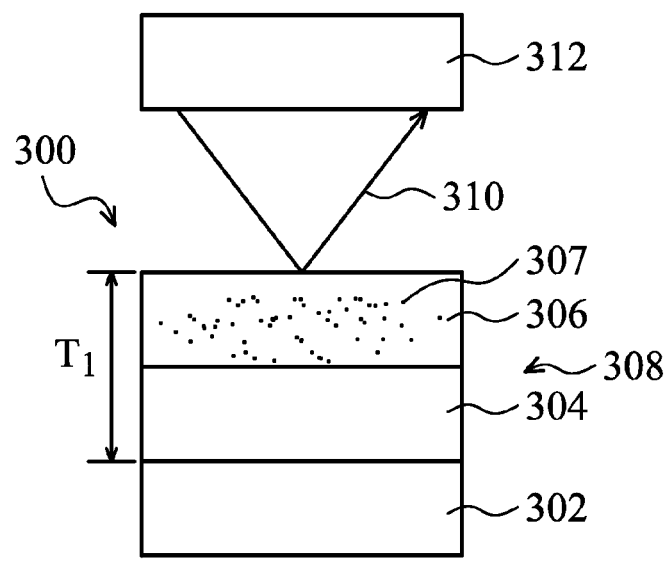

In FIG. 3C, the first thickness measurement 310 is conducted on the stacked structure 308. The first thickness $T_1$ of the stacked structure 308 is measured. The first thickness measurement 310 may be conducted by using an optical operation. For example, the first thickness measurement 310 may be conducted by using an optical thickness measuring instrument 312, such as an ellipsometer (FX series, KLA-Tencor) or other suitable optical measuring instruments, to measure the first thickness $T_1$. The ellipsometer uses polarized light to determine film thickness, and can be limited to point measurement. The first thickness measurement 310 is damage-free for the semiconductor device 300 and can be accomplished in a short time. For example, the first thickness treatment 310 may take a time period ranging from about 5 minutes to about 7 minutes.

Experiments show that the main impurity in high-k dielectric film 306 is metal impurity 307, such as metal elements and/or their ions. For example, the metal impurity 307 in the high-k dielectric film may include ions of Ti, Fe, Al, Cr, Ni, Co, Cu, Ca, Mg or Zn or a combination thereof.

Figure 3D:
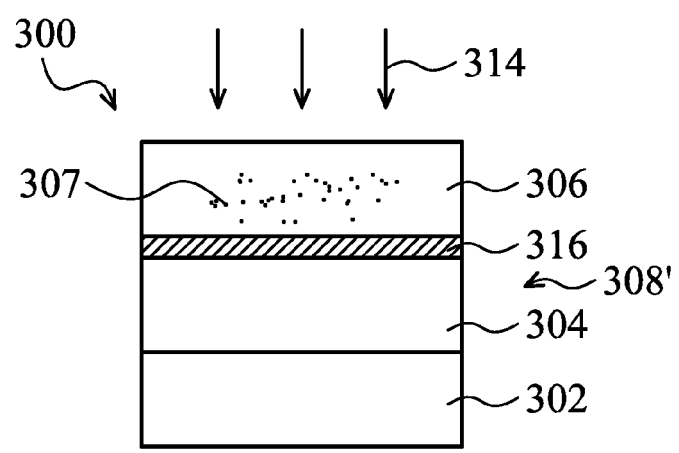

In FIG. 3D, a treatment 314 is performed on the semiconductor device 300. The treatment 314 may include an annealing process. The annealing process may include rapid thermal annealing (RTA), furnace annealing, flash lamp annealing (FLA), laser spike annealing (LSA), or a combination thereof. In some embodiments, the annealing process uses a temperature ranging from about 600° C. to about 1100° C. In some embodiments, the annealing process is carried out in an $O_2$ ambient or in an $O_2/N_2$ ambient.

The annealing process may force the metal impurity 307 in the high-k film 306 diffuse to an interface between the high-k dielectric film 306 and the interfacial layer 304. In addition, the metal impurity 307 such as a metal ion may form a metal oxide compound with the oxygen atoms in the $O_2$ or $O_2/N_2$ ambient. Afterwards, the metal oxide compound may further react with the non-reacted silicon in the interfacial layer 304 to form silicon oxide, and the metal oxide compound is transformed back to the metal ion. Accordingly, a regrowth layer 316 is formed between the high-k dielectric film 306 and the interfacial layer 304. The regrowth layer 316 is a silicon oxide layer. After the treatment 314, the stacked structure 308 transforms into a stacked structure 308'. The stacked structure 308' may further include the regrowth layer 316 when compared to the stacked structure 308 before the treatment 314. In some embodiments, $Ti^{4+}$ is the main impurity in the high-k dielectric film 306, and the mechanism of the formation of the regrowth layer 316 is illustrated below:

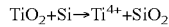

In some embodiments, the treatment 314 further includes performing a nitridation process on the high-k dielectric film 306 prior to the annealing process. The nitridation process includes decouple plasma nitridation or post nitridation annealing. The plasma energy of the plasma decouple nitridation is in a range from about 1000 kJ to about 3000 kJ. The nitridation process may compensate the lattice vacancies in the high-k dielectric film 306 and may further assist in the diffusion of the impurity during the annealing process.

Figure 3E:
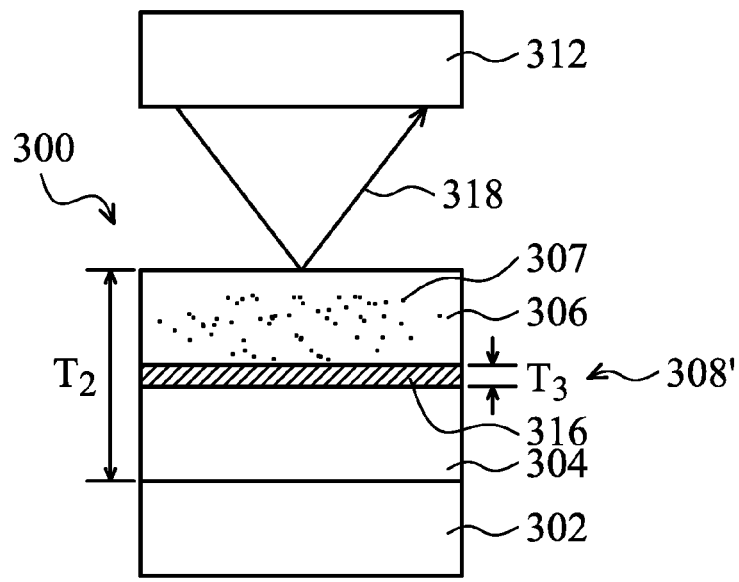
Figure 3F:
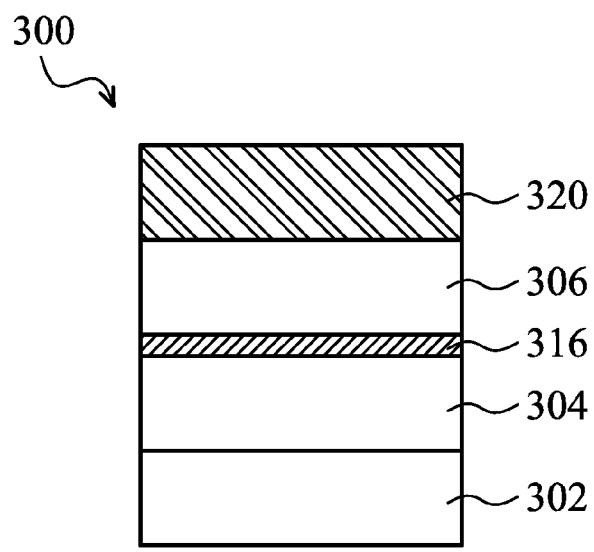

Afterwards, in FIG. 3E, the second thickness measurement 318 is conducted on the stacked structure 308' after the treatment 314. The thickness $T_2$ of the stacked structure 308' is measured. The thickness $T_2$ of the stacked structure 308' may be measured by the same optical operation and instrument 312 as illustrated in FIG. 3C. The second thickness measurement 318 is damage-free for the semiconductor device 300 and can be accomplished in a short time. For example, the second thickness measurement 318 may take a time period ranging from about 5 minutes to about 7 minutes. The thickness T3 of the regrowth layer 316 can be determined by calculating the difference between the thicknesses $T_1$ and $T_2$.

Figure 4:
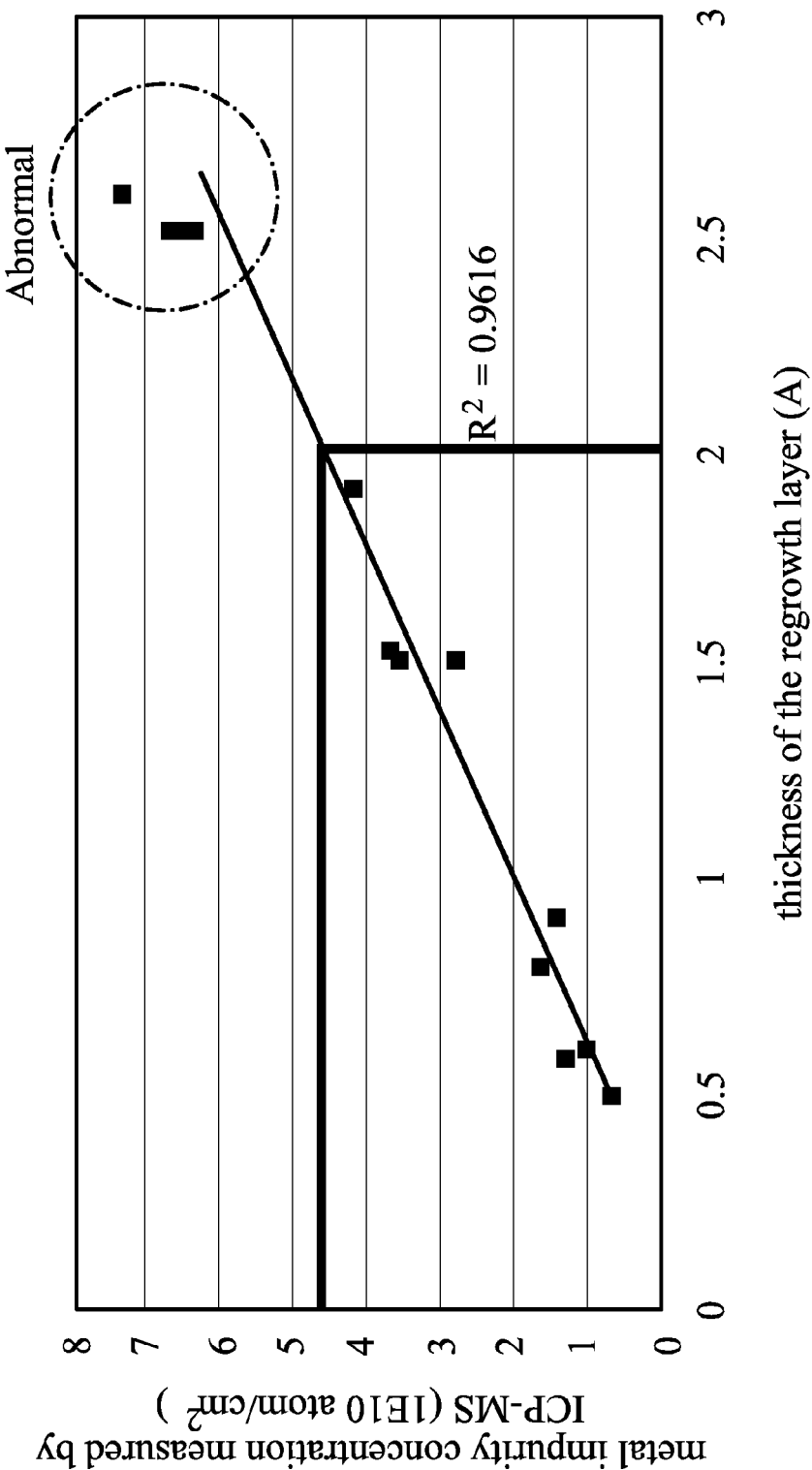
FIG. 4 shows the thickness of the regrowth layer as a function of concentration of metal impurity in the high-k dielectric film, in accordance with some embodiments.

Experiments show that the thickness $T_3$ of the regrowth layer 316 has a substantially linear correlation to the concentration of impurity in the high-k dielectric film 306. Please refer to FIG. 4, the thickness $T_3$ of the regrowth layer 316 is illustrated as a function of concentration of the metal impurity in the high-k dielectric film 306. In these cases, the metal impurity is $Ti^{4+}$. In FIG. 4, the metal impurity concentration is measured by ICP-mass spectrometry. FIG. 4 shows that the thickness $T_3$ of the regrowth layer 316 has a strong linear correlation to the metal impurity concentration in the high-k dielectric film 306. The thickness $T_3$ of the regrowth layer 316 increases substantially linearly with the increase in the metal impurity concentration in the high-k dielectric film 316. In addition, the regression line of the thickness $T_3$ and the metal impurity concentration has a R-square value greater than about 0.96. The result shows the transformation of the concentration of the metal impurity in the high-k dielectric film 306 from the thickness $T_3$ of the regrowth layer 316 is reliable.

For example, as shown in FIG. 4, the concentration of the metal impurity in the high-k dielectric film 306 is about 4.5E10 atoms/$cm^2$ when the thickness $T_3$ of the regrowth layer 316 is about 2 Å. Experiments also shows that high-k dielectric film 306 has a shift of about 0.3 Å of the equivalent oxide thickness (EOT) when the thickness $T_3$ is about 2 Å, and such a shift of the EOT may lead to device performance shift. In some embodiments, the quality of the high-k dielectric film 306 is considered as acceptable when the thickness $T_3$ of the regrowth layer 316 is smaller than about 2 Å.

Therefore, the concentration of the metal impurity in the high-k dielectric film 306 can be directly transformed from the thickness $T_3$ of the regrowth layer 316 by their correlation line. In some embodiments, the correlation line of the thickness $T_3$ of the regrowth layer 316 and the metal impurity concentration measured by the ICP-mass spectrometry can be constructed before, during or after the fabrication of the semiconductor device 300.

The thickness measurement of the regrowth layer 316 is damage free for the semiconductor device 300 and takes only a short time, such as several minutes. Therefore, the impurity concentration of the high-k dielectric film 306 may be monitored in real-time and in an inline manner. In some embodiments, the impurity concentration of the high-k dielectric film 306 is monitored at a frequency of every six pieces of wafer. Furthermore, the thickness measurements 310 and 316 can be limited to point measurement. It is easy to find out what point on the high-k dielectric film 306 is abnormal and needs troubleshooting. For example, the tool for depositing the high-k dielectric film 306 may usually include a number of precursor gas cylinders to spray the precursors to different sites on the substrate. From the point measurement, it is easy to know which one of the precursor gas cylinders provides the precursors with high impurity.

The semiconductor device 300 may undergo further CMOS or MOS technology processing to form various features. For example, in FIG. 3F, a gate electrode layer 320 is deposited over the high-k dielectric film 306. The gate electrode layer 320 is formed by any suitable process to any suitable thickness. For example, an atomic layer deposition (ALD) or physical vapor deposition (PVD) process may be used to form the gate electrode layer 320. N-metal and p-metal structures may be formed. The gate electrode layer 320 may comprise a work function material and an additional conductive layer. The work function layer and the additional conductive layer includes any suitable material, such as aluminum, copper, tungsten, titanium, tantalum, titanium nitride, tantalum nitride, nickel silicide, cobalt silicide, silver, TaC, TaSiN, TaCN, TiAl, TiAlN, WN, metal alloys, polysilicon, other suitable materials, and/or a combination thereof. Exemplary work function layers for an NMOS device include tantalum nitride, titanium aluminum, titanium aluminum nitride, or combinations thereof. Exemplary work function layers for a PMOS device may include tungsten, titanium nitride, tungsten nitride, or a combination thereof.

Embodiments of mechanisms for fabricating a semiconductor device with monitoring impurity concentration in a high-k dielectric film of the semiconductor device are provided. The impurity concentration in the high-k dielectric film may be monitored in real-time and in an inline manner by measuring the thickness difference of a stacked structure of the high-k dielectric film and an interfacial layer before and after a treatment. In addition, the frequency of monitoring the impurity concentration in the high-k dielectric film may be significantly increased, and it is easy to know what point on the high-k dielectric film is abnormal.

In accordance with some embodiments, a method for monitoring metal impurity in a high-k dielectric film is provided. The method includes forming an interfacial layer over a substrate. The method also includes forming a high-k dielectric film on the interfacial layer, and the interfacial layer and the high-k dielectric film form a stacked structure over the substrate. The method further includes conducting a first thickness measurement on the stacked structure. In addition, the method includes performing a treatment to the stacked structure after the first thickness measurement, and the treatment includes an annealing process. The method also includes conducting a second thickness measurement on the stacked structure after the treatment.

In accordance with some embodiments, a method of fabricating a semiconductor device is provided. The method includes forming an interfacial layer over a substrate, and the interfacial layer includes silicon oxide. The method also includes forming a high-k dielectric film on the interfacial layer, and the interfacial layer and the high-k dielectric film form a stacked structure over the substrate. The method further includes monitoring a concentration of metal impurity in the high-k dielectric film. The monitoring includes measuring a first thickness of the stacked structure. The monitoring also includes performing a treatment to the stacked structure after measuring the first thickness, and the treatment comprises an annealing process. The monitoring further includes measuring a second thickness of the stacked structure after the treatment. In addition, the monitoring includes transforming the difference between the second thickness and the first thickness to the concentration of the metal impurity. In addition, the method includes forming a gate electrode layer over the high-k dielectric film.

In accordance with some embodiments, a method of fabricating a semiconductor device is provided. The method includes forming a silicon oxide layer over a substrate. The method also includes forming a HfO$_2$ layer on the silicon oxide layer, and the silicon oxide layer and the HfO$_2$ layer form a stacked structure over the substrate. The method further includes monitoring a concentration of Ti-ions in the HfO$_2$ layer. The monitoring includes measuring a first thickness of the stacked structure. The monitoring also includes performing a treatment to the stacked structure after measuring the first thickness. The treatment includes a nitridation process and an annealing process, and the annealing process promotes a regrowth layer formed between the HfO$_2$ layer and the silicon oxide layer. The monitoring further includes measuring a second thickness of the stacked structure after the treatment. In addition, the monitoring includes calculating the thickness of the regrowth layer from the first thickness and the second thickness. The monitoring also includes transforming the thickness of the regrowth layer to the concentration of the Ti-ions. The method includes forming a gate electrode layer over the high-k dielectric film.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A method for in-line monitoring metal impurity in a high-k dielectric film of a semiconductor device, comprising: during in-line operations, obtaining a first thickness by conducting a first thickness measurement on a stacked structure over a substrate prior to an annealing treatment, the stacked structure comprising an interfacial layer disposed over the substrate and a high-K dielectric film stacked over the interfacial layer, each of the interfacial layer and the high-K film having substantially uniform thickness, wherein the high-K dielectric film contains intrinsic metal impurity; performing annealing treatment over the stacked structure without substantially altering thickness uniformity thereof to cause metal impurity diffusion between the high-K dielectric film and the interfacial layer and a generation of a re-growing layer there-between; obtaining a second thickness by conducting a second thickness measurement on the stack structure; obtaining a thickness difference between the first thickness and the second thickness, wherein the thickness difference is the thickness of the regrown layer; performing a threshold condition check of metal impurity concentration by positively linearly correlating the thickness difference with a metal impurity concentration profile obtained by previously collected data or historical data from ICP-mass spectrometry; and forming a gate electrode layer over and in direct contact with the high-k dielectric film if the metal impurity is within a threshold condition, wherein the threshold condition is when the thickness of the regrown layer is less than 2 Å and the concentration of the metal impurity is less than 4.5E10 atoms/cm2.

2. The method of claim 1, wherein the interfacial layer comprises a silicon oxide layer.

3. The method of claim 1, wherein the high-k dielectric film comprises $HfO_2$, LaO, AlO, ZrO, $Ta_2O_5$, $Y_2O_3$, BaZrO, HfZrO, HfLaO, HfTaO, HfSiO, HfSiON, LaSiO, AlSiO, $Al_2O_3$ or a combination thereof.

4. The method of claim 1, wherein the annealing process treatment uses a temperature range of from about 600° C. to about 1100° C.

5. The method of claim 1, wherein the first thickness measurement and the second thickness measurement are conducted by an optical operation.

6. The method of claim 5, wherein the optical operation comprises using an ellipsometer.

7. The method of claim 1, wherein the metal impurity comprises ions of Ti, Fe, Al, Cr, Ni, Co, Cu, Ca, Mg or Zn or a combination thereof.

* * * * *